(12) United States Patent
Li et al.

(10) Patent No.: US 6,405,136 B1
(45) Date of Patent: Jun. 11, 2002

(54) DATA COMPRESSION METHOD FOR USE IN WELLBORE AND FORMATION CHARACTERIZATION

(75) Inventors: Qiming Li, Sugar Land; John Lovell; Mark Fredette, both of Houston, all of TX (US)

(73) Assignee: Schlumberger Technology Corporation, Sugar Land, TX (US)

(*) Notice: Subject to any disclaimer, the term of this patent is extended or adjusted under 35 U.S.C. 154(b) by 0 days.

(21) Appl. No.: 09/602,860

(22) Filed: Jun. 23, 2000

Related U.S. Application Data
(60) Provisional application No. 60/159,727, filed on Oct. 15, 1999.

(51) Int. Cl.[7] .................................................. G01V 3/18
(52) U.S. Cl. ........................... 702/10; 702/9; 367/81; 175/45; 73/152.03; 73/152.45; 340/855.6; 340/855.7
(58) Field of Search ............................... 702/10, 9, 7, 8; 367/81–83; 33/304, 312, 313; 73/152.01, 152.03, 152.45, 152.43, 152.44, 152.46; 175/40, 45, 50, 44; 340/853.1, 853.6, 854.1, 854.6, 855.4, 855.5, 855.6, 855.7

(56) References Cited

U.S. PATENT DOCUMENTS

| | | |
|---|---|---|
| 4,661,933 A | 4/1987 | Seeman et al. |
| 5,191,548 A | 3/1993 | Balkanski et al. |
| 5,339,036 A | 8/1994 | Clark et al. |
| 5,579,248 A | 11/1996 | Nieto et al. |
| 5,610,657 A | 3/1997 | Zhang |
| 5,684,693 A | 11/1997 | Li |
| 5,757,852 A | 5/1998 | Jericevic et al. |
| 5,852,587 A | 12/1998 | Kostek et al. |
| 6,021,378 A | 2/2000 | Reiter et al. |

FOREIGN PATENT DOCUMENTS

| | | |
|---|---|---|
| GB | 2225118 A | 5/1990 |
| GB | 2307833 A | 4/1997 |
| GB | 2307380 A | 5/1997 |
| WO | WO 97/13164 A1 | 4/1997 |

*Primary Examiner*—Donald E. McElheny, Jr.
(74) *Attorney, Agent, or Firm*—John J. Ryberg; Brigitte L. Jeffery; Victor H. Segura

(57) ABSTRACT

A method is disclosed for compressing a frame of data representing parameter values, a time at which each parameter value was recorded, and an orientation of a sensor at the time each parameter value was recorded. Generally the method includes performing a two-dimensional transform on the data in the orientation domain and in a domain related to the recording time. In one embodiment, the method includes calculating a logarithm of each parameter value. In one embodiment, the 2-D transform includes generating a Fourier transform of the logarithm of the parameter values in the azimuthal domain, generating a discrete cosine transform of the transform coefficients in the time domain. This embodiment includes quantizing the coefficients of the Fourier transform and the discrete cosine transform. One embodiment of the method is adapted to transmit resistivity measurements made by an LWD instrument in pressure modulation telemetry so that while-drilling images of a wellbore can be generated. The one embodiment includes encoding the quantized coefficients, error encoding the encoded coefficients, and applying the error encoded coefficients to the pressure modulation telemetry.

72 Claims, 5 Drawing Sheets

DATA COMPRESSION METHOD FOR USE IN WELLBORE AND FORMATION CHARACTERIZATION

CROSS-REFERENCES

This present application claims the benefit of U.S. Provisional Application No. 60/159,727 filed Oct. 15, 1999.

FIELD OF THE INVENTION

The invention is related generally to the field of data communication between wellbore measuring instruments and surface recording systems adapted thereto. More specifically, the invention is related to techniques for compressing data before encoding in a selected telemetry format, and decompressing the data to recover the most significant information contained in the originally measured data.

DESCRIPTION OF THE RELATED ART

Many types of well logging instruments have been adapted to make measurements which can be converted into a visual representation or "image" of the wall of a wellbore drilled through earth formations. Typical instruments for developing images include electrical resistivity measuring devices and acoustic reflectance/travel time measuring devices. These instruments measure a property of the earth formations proximate to the wall of the wellbore, or a related property, with respect to azimuthal direction, about a substantial portion of the circumference of the wellbore. The values of the property measured are correlated to both their depth position in the wellbore and to their azimuthal position with respect to some selected reference, such as geographic north or the gravitationally uppermost side of the wellbore. A visual representation is then developed by presenting the values, with respect to their depths and azimuthal orientations, for instance, using a color or gray tone which corresponds to the value of the measured property.

Wellbore images are typically developed using logging instruments that are lowered into and retrieved from the wellbore at one end of an electrical cable. The measurements made by the instrument, including value of the property being measured and measurements corresponding to the azimuthal orientation of the measurements, are transmitted to the recording and interpretation equipment at the earth's surface. Other types of instruments, known as "logging while drilling" (LWD) instruments, are conveyed at the end of a drilling assembly used to drill the wellbore. An advantage of LWD instruments is that they measure properties of the formation during the drilling of the wellbore. Often the values of certain formation properties are of use to the wellbore operator when determined during drilling for purposes such as deciding at which depth to set a protective pipe or casing, steering the wellbore into the target formations, and determining whether the formations are likely to contain commercially useful quantities of hydrocarbons.

LWD instruments, in some cases, include a provision for sending at least some of the measurements made to recording equipment at the earth's surface at the time the measurements are made using a telemetry system. One such telemetry system modulates the pressure of a drilling fluid pumped through the drilling assembly to drill the wellbore. The fluid pressure modulation telemetry systems known in the art, however, are limited to transmitting data at a rate of at most only a few bits per second. Because the volume of data measured by the typical image-generating well logging instrument is relatively large, at present, borehole images are generally available only using electrical cable-conveyed instruments, or after an LWD instrument is removed from the wellbore and the contents of an internal storage device, or memory, are retrieved.

One method known in the art for transmitting image-generating measurements in pressure modulation telemetry is described, for example, in U.S. Pat. No. 5,519,668 issued to Montaron. This method includes making resistivity measurements at preselected azimuthal orientations, and transmitting to the surface through the pressure modulation telemetry only the resistivity values. The method described in the Montaron '668 patent requires synchronization of the resistivity measurements to known rotary orientations of the LWD instrument to be able to decode the image data at the surface without transmitting the corresponding rotary orientations at which the measurements were made.

Other data compression techniques, for various applications, are described in several other U.S. patents, for example, U.S. Pat. No. 5,757,852 to Jericevic et al; U.S. Pat. No. 5,684,693 to Li; U.S. Pat. No. 5,191,548 to Balkanski et al; U.S. Pat. No. 5,301,205 to Tsutsui et al; U.S. Pat. No. 5,388,209 to Akagiri; U.S. Pat. No. 5,453,844 to George et al; U.S. Pat. No. 5,610,657 to Zhang; and U.S. Pat. No. 6,049,632 to Cockshott et al. Most prior art data compression techniques for audio and video data compression and storage do not contemplate the extremely low bandwidth and very high noise level of the telemetry channel of the typical LWD pressure modulation telemetry system, and, have not been suitable for image transmission by such telemetry.

It is desirable to have a system which enables transmission of data for imaging a wellbore through pressure modulation telemetry so that images of a wellbore can be developed during the drilling of a wellbore, wherein the rotary orientation of each image-developing measurement is included in the transmitted data. It is also desirable to have a data compression system which facilitates measuring the rate at which rock is drilled and makes estimates of orientation of boundaries between layers of earth formations.

SUMMARY OF THE INVENTION

One aspect of the invention is a method for compressing a frame of data representing parameter values, a time at which each of the parameter values was recorded, and a corresponding azimuthal orientation at the time each of the parameter values was recorded. The method according to this aspect of the invention includes range compressing the parameter values. The method includes choosing a compression transforms that takes advantage of the natural periodicity of the data in the azimuthal direction, and then applying the transform in two-dimensions to the scale compressed parameter values, an output of the transform comprising a set of coefficients, and quantizing the coefficients.

One embodiment of this aspect of the invention includes a Fourier transform in the azimuthal domain and a discrete cosine transform in a domain corresponding to the time of recording. The corresponding domain can be the time itself or the depth domain, for example, where the term depth domain pertains to a measurement along the length of the wellbore.

In one embodiment of this aspect of the invention, the method further comprises encoding the quantized coefficients. One example of encoding includes efficient entropy encoding. In one embodiment, the method further comprises error-correction encoding the encoded quantized coefficients. One example of error-correction encoding includes interleaved encoding. One example of interleaved encoding comprises separating bits in a frame of data into words each having equal length, selecting correspondingly positioned bits in each of the words to form new words, and Hamming encoding the new words.

One embodiment of this aspect of the invention includes applying the Hamming encoded new words to a selected location in a telemetry sequence, and transmitting the Hamming encoded new words to a recording unit. Another aspect of the invention is a method for acquiring and communicating image developing to a surface recording unit. The method according to this aspect of the invention includes measuring a value of a parameter of an earth formation penetrated by a wellbore at azimuthally spaced apart positions in the wellbore, determining a rotary, or azimuthal, orientation at which each of the values of the parameter is measured, and determining a time at which each of the values of the parameter is measured. The parameter values are compressing and encoded, and the encoded, compressed parameter values are applied to a selected position in a telemetry format for transmission to the surface recording unit. In one embodiment, the compression includes range compression of the parameter values, such as by calculating a logarithm of each parameter value. The compression in this embodiment further includes calculating a Fourier transform of the parameter values in the azimuthal domain, and calculating a discrete cosine transform in the time domain. The transform coefficients in this example are quantized and encoded. In this embodiment, the encoding comprises efficient entropy encoding. One embodiment of this aspect of the invention includes error correction encoding, which in this embodiment is an interleaved encoding scheme, including separating bits in a frame of data into words each having equal length, selecting correspondingly positioned bits in each of the words to form new words, and Hamming encoding the new words.

One embodiment of this aspect of the invention includes applying the Hamming encoded new words to a selected location in a telemetry sequence, and transmitting the Hamming encoded new words to the surface recording unit.

Another aspect of the invention is a method for determining the rate of penetration of a drilling assembly in a wellbore as part of the compression process. This method includes measuring, near the drilling assembly, a property of earth formations penetrated by the drilling assembly. The measuring is performed by sensors at axially spaced apart locations on the drilling assembly. A time at which each of the measurements of the property are made is recorded. An azimuthal orientation of the sensors at the time each of the measurements is made is also recorded. Azimuthally corresponding ones of the measurements made at a first one of the spaced apart locations are correlated to measurements made at a second one of the spaced apart locations. It is then determined, from the correlating, when the first and the second one of the spaced apart locations have made measurements in substantially the same earth formation. The rate of penetration is calculated from a difference in time between the measurements made in the substantially same earth formation at the first and second spaced apart locations and from a distance between the first and second spaced apart locations.

One embodiment of this aspect of the invention includes correcting a time-depth record of the instrument made at the earth's surface for the rate of penetration of the instrument thus determined.

Another embodiment of this aspect of the invention includes making the axially spaced apart measurements at a plurality of azimuthally spaced apart positions around the wellbore and determining a dip of earth formations penetrated by the wellbore by correlating the measurements made at azimuthally corresponding positions and calculating an axial displacement of formation boundaries with respect to the wellbore.

A third embodiment of this aspect of the invention included making the image-based correlation over time from the transformed data. This process can even be used to further compress image data measured by a plurality of sensors, by removing that part of the variation between the sensor measurements that is due to variation in the rate of penetration.

Another aspect of the invention is the derivation of additional parameters of interest as part of the compression process.

One embodiment of this aspect of the invention relates to the derivation of the azimuth of bedding planes intersected by the wellbore as part of the compression process. One embodiment of this compression scheme required the discrete cosine transform in the time domain together with choosing an azimuthal reference and taking a Fourier transform in azimuthal domain with respect to that reference. The output of the Fourier transform includes coefficients which are magnitudes of sine and cosine components in the azimuthal wavenumber domain. The size of the coefficients corresponding to the sine terms depends upon the azimuthal reference that is used to define the Fourier transform. An azimuthal reference which minimizes the size of the sine terms is precisely the azimuth about which the bedding planes will appear to be symmetrically positioned around the wellbore. This is the azimuth of the dipping plane. In this embodiment of the invention, the azimuthal reference which results in minimum size of the sine term coefficients is selected, and the corresponding azimuth of the dipping planes along with the sine terms, whose values will have been minimized by the process of subtracting the azimuth, are transmitted to the surface recording unit in LWD telemetry.

Other aspects and advantages of the invention will be apparent from the description which follows.

DETAILED DESCRIPTION OF SPECIFIC EMBODIMENTS

Figure 1:
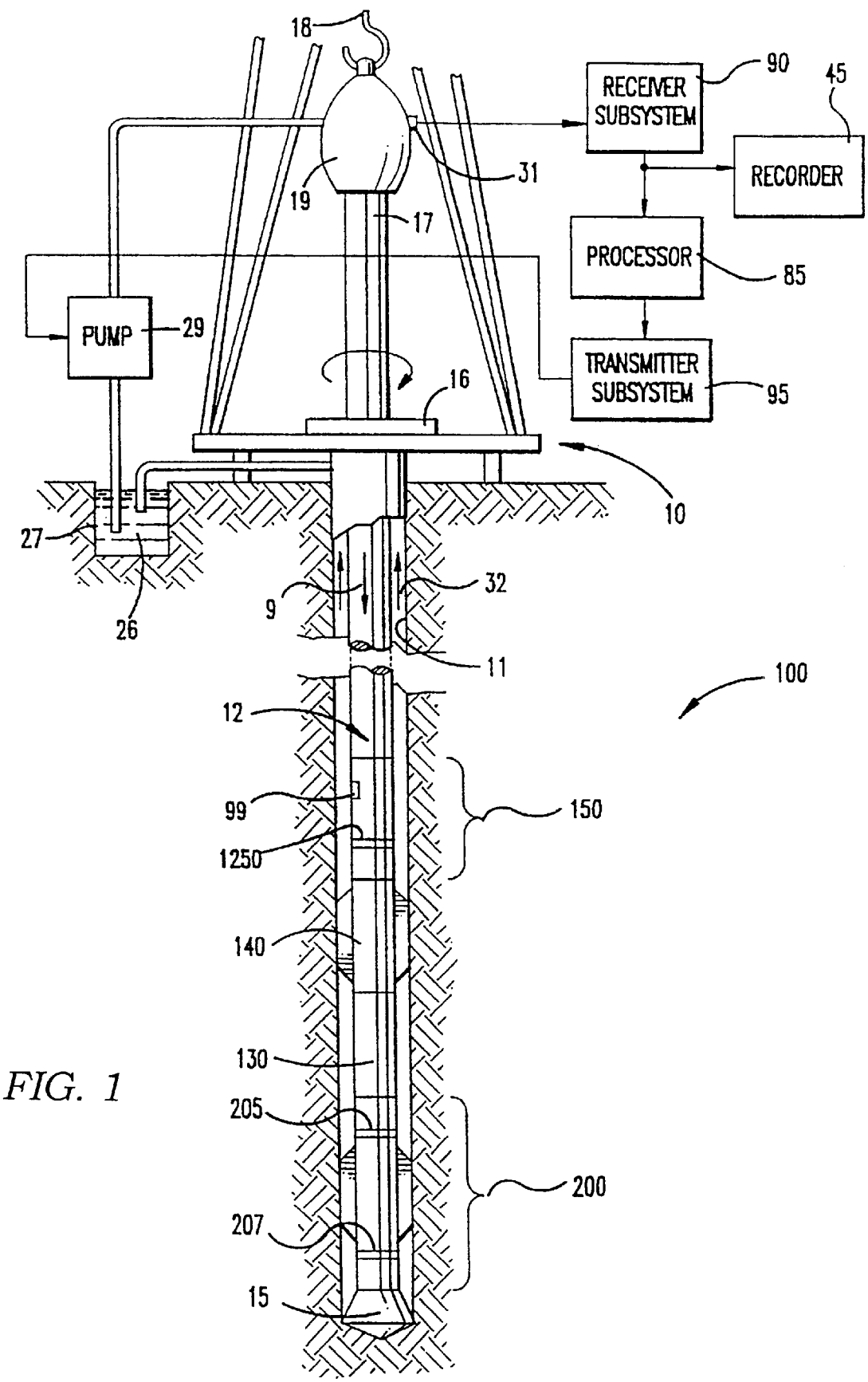
FIG. 1 shows a general view of a measurement while drilling system including one example of a logging while drilling (LWD) instrument.

Data Acquisition and Data Compression: Generally speaking, this aspect of the invention relates to data communication between a logging while drilling (LWD) instrument and a recording system located at the earth's surface. Data communication between the LWD instrument and the surface, while the LWD instrument is in a wellbore, is typically performed using various types of pressure modulation on the flow of a drilling fluid through a drilling tool assembly. The drilling tool assembly includes the LWD instrument and an associated fluid pressure modulator. An LWD instrument particularly suited for use with this invention is described in U.S. Pat. No. 5,339,036 issued to Clark et al (Clark '036), incorporated herein by reference. The use of the LWD instrument in conjunction with a measurement while drilling (MWD) instrument and telemetry system is shown generally in FIG. 1. For convenience, the instrument combination of LWD and MWD will be referred to hereinafter as the "LWD instrument". A drilling rig including a derrick 10 is positioned over a wellbore 11, which is drilled by a process known as rotary drilling. A drilling tool assembly ("drill string") 12 and drill bit 15 coupled to the lower end of the drill string 12 are disposed in the wellbore 11. The drill string 12 and bit 15 are turned, by rotation of a kelly 17 coupled to the upper end of the drill string 12. The kelly 17 is rotated by engagement with a rotary table 16 or the like forming part of the rig 10. The kelly 17 and drill string 12 are suspended by a hook 18 coupled to the kelly 17 by a rotatable swivel 19. Alternatively, the kelly 17, swivel 19 and rotary table 16 can be substituted by a "top drive" or similar drilling rotator known in the art.

Drilling fluid ("drilling mud") is stored in a pit 27 or other type of tank, and is pumped through the center of the drill string 12 by a mud pump 29, to flow downwardly (shown by arrow 9) therethrough. After circulation through the bit 15, the drilling fluid circulates upwardly (indicated by arrow 32) through an annular space between the wellbore 11 and the outside of the drill string 12. Flow of the drilling mud lubricates and cools the bit 15 and lifts drill cuttings made by the bit 15 to the surface for collection and disposal.

A bottom hole assembly (BHA), shown generally at 100 is connected within the drill string 12. The BHA 100 includes in this example a stabilizer 140 and drill collar 130 which mechanically connect a local measuring and local communications device 200 to the BHA 100. In this example, the BHA 100 includes a toroidal antenna 1250 for electromagnetic communication with the local measuring device 200, although it should be understood that other communication links between the BHA 100 and the local device 200 could be used with the invention. The BHA 100 includes a communications system 150 which provides a pressure modulation telemetry transmitter and receiver therein. Pressure modulation telemetry can include various techniques for selectively modulating the flow (and consequently the pressure) of the drilling mud flowing downwardly 9 through the drill string 12 and BHA 100. One such modulation technique is known as phase shift keying of a standing wave created by a "siren" (not shown) in the communications system 150. A transducer 31 disposed at the earth's surface, generally in the fluid pump discharge line, detects the pressure variations generated by the siren (not shown) and conducts a signal to a receiver decoder system 90 for demodulation and interpretation. The demodulated signals can be coupled to a processor 85 and recorder 45 for further processing. Optionally, the surface equipment can include a transmitter subsystem 95 which includes a pressure modulation transmitter (not shown separately) that can modulate the pressure of the drilling mud circulating downwardly 9 to communicate control signals to the BHA 100.

The communications subsystem 150 may also include various types of processors and controllers (not shown separately) for controlling operating of sensors disposed therein, and for communication command signals to the local device 200 and receiving and processing measurements transmitted from the local device 200. Sensors in the BHA 100 and/or communications system 150 can include, among others, magnetometers and accelerometers (not shown separately in FIG. 1). As is well known in the art, the output of the magnetometers and accelerometers can be used to determine the rotary orientation of the BHA 100 with respect to earth's gravity as well as a geographic reference such as magnetic and/or geographic north. The output of the accelerometers and magnetometers (not shown) can also be used to determine the trajectory of the wellbore 11 with respect to these same references (or other selected reference), as is well known in the art. As previously explained, the instrumentation disposed in the BHA 100, the communications system 150 and the local measuring and communication device 200 will be referred to collectively hereinafter for convenience as the "LWD instrument". The BHA 100 and or the communications system 150 can include various forms of data storage or memory which can store measurements made by any or all of the sensors, including sensors disposed in the local instrument 200, for later processing as the drill string 12 is withdrawn from the wellbore 11.

Figure 2:
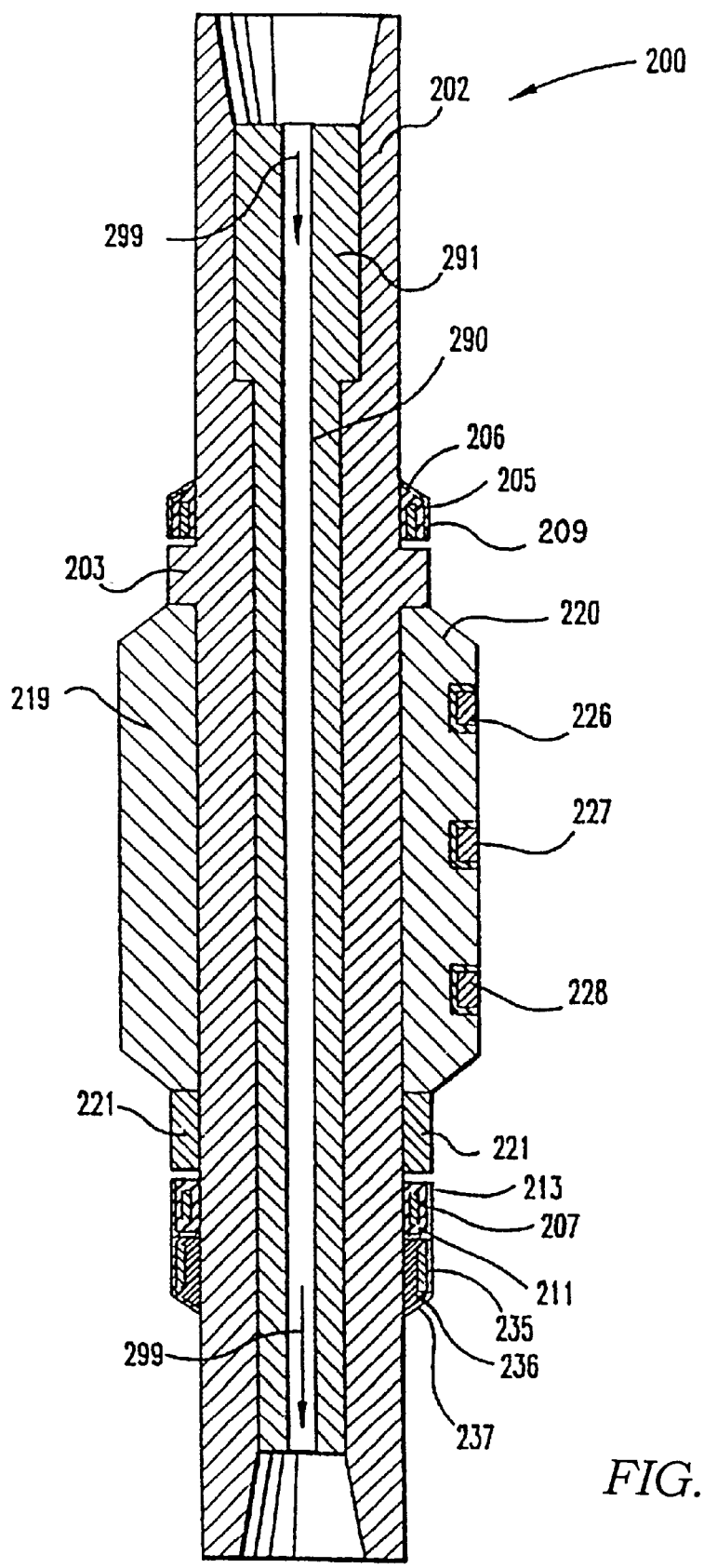
FIG. 2 shows a cross section of the LWD instrument shown in FIG. 1.

FIG. 2 shows the local measuring and communications device 200 in more detail. The local measuring device 200 includes, on a segment of tubular drill collar 202, an antenna 205 for establishing a voltage profile along the surface of the drill collar. This antenna 205 may also be used to transmit data to and receive data from the communications system. Electrical currents flow in the drilling mud and in the formations in response to the voltage profile established on the collar. These currents are measured by various sensors on the local measuring device and are transformed, by a processor in the local measuring device, into values of formation resistivity. In this embodiment, the sensors are electrodes 226, 227, 228, positioned at spaced apart locations on a stabilizer blade 220. Another sensor for measuring electrical current is ring electrode 235. The manner of making resistivity measurements by measuring voltages at the electrodes 226, 227, 228 is well described in Clark '036.

It should be clearly understood that the method of the invention, which will be more fully described below, is usable with measurements of formation properties other than electrical resistivity. For example, acoustic reflectance amplitude and/or acoustic travel time to and from the sensor position to the wellbore wall can also be used with the invention. An instrument which is capable of making acoustic reflectance amplitude and/or acoustic reflectance travel time measurements is described, for example, in U.S. Pat. No. 4,661,933 issued to Seeman et al and assigned to the assignee of this invention. U.S. Pat. No 5,852,587, also assigned to the assignee of this invention, describes an apparatus suitable for making, while drilling a wellbore is in progress, acoustic travel time measurements characteristic of the earth formations.

Another example of measurements which can be used with the invention include gamma-gamma density measurements, made at one or more axially and/or azimuthally spaced apart sensors on the LWD instrument. An example of an apparatus suitable for making gamma—gamma density measurements while drilling is described in U.S. Pat. No. 5,473,158 issued to Holenka et al, and assigned to the assignee of this invention. The foregoing instruments for making measurements of acoustic properties and gamma-gamma density have several advantages which are well described in the respective patents, but it should be clearly understood that the instrument disclosed in these patents are not the only instruments that can be used to make such measurements. Accordingly, the invention is not to be limited to using measurements made by the particular instruments described in any of the foregoing patents.

To generate measurements which can be used to develop a visual representation (image) of the wall of the wellbore, it is necessary to make measurements of the particular formation parameter being used to develop the image (in this example, electrical resistivity) which represent or "cover" a substantial fraction of the circumference of the wellbore wall. This is performed in the measurement process using the local measuring device 200 by making measurements during rotation of the drill string 12 (referred to in the art as "while rotating").

The measurements of the formation property are stored in a memory or buffer in the LWD instrument and are selectively interrogated by a telemetry controller in the LWD instrument so that the measurements, or selected subsets of the measurements, can be transmitted to the surface recording system by applying them to the drilling fluid pressure modulation telemetry system. Because of the very large number of corresponding measurements of rotary orientation and resistivity, a practical means of using the pressure modulation telemetry must include a very high compression ratio data compression technique.

In the data compression technique according to this embodiment of the invention, the image (resistivity measurements) data are transformed into discrete cosine and Fourier coefficients to achieve high compression ratio. Mathematically, data used to develop wellbore images can be represented as a two dimensional data array R(m, n) where m represents a time index for each measurement (parameter value) acquired, and n represents an azimuthal index for each data point acquired, where this azimuthal index is taken with respect to a chosen reference direction. R represents the value of the measured parameter, which in this example is electrical resistivity. A feature of data acquired during rotation of the drilling tool assembly (and the LWD instrument) is substantial azimuthal continuity between the data recorded at the first azimuthal index (m=1) and at the last azimuthal index (m=M), in a frame of data, because they represent two neighboring azimuthal directions with respect to the wellbore. This continuity may not exist in time, of course, because the measurements made at the first time index (n=1) and those made at the last time index (n=N) in a frame of data represent formation parameters (resistivity) measured at two different axial positions (depths) along the wellbore when the LWD instrument moves along the wellbore. The recording depths at the beginning and end of any frame of data may or may not be close to each other (depending on the rate of axial progress, or "rate of penetration" during the time).

Because of the periodicity of R(m, n) with respect to azimuthal orientation, the method of the invention preferably includes, as a compression technique, applying a Fourier transform to the resistivity values in the azimuthal domain (direction). For periodic data, the components decay faster if the Fourier transform uses a combination of sines and cosines. In this embodiment, the compression transform includes a discrete cosine-transform in the time domain. The use of cosines is preferred when a sharp discontinuity exists across the boundaries of the image frame that are being compressed. Thus, the compression used in the invention is distinct from standard (such as JPEG) image compression where discrete cosine transforms are applied in both the horizontal and the vertical directions of an image data block.

Implicit in the application of the Fourier transform to the image data is the selection of one azimuth as a reference, or first azimuthal index in a data block or frame. The output of the Fourier transform will then be composed of a series of sines and cosines with respect to that index. The sine terms correspond to that component of the image which is anti-symmetric about the index, and the cosine terms correspond to the image component which is symmetric about the index. In one embodiment of the invention the azimuthal index is selected so as to minimize the "energy" of the sine terms. Energy is defined here as the sum of the squares of the coefficients of the sine terms. Once this energy has been minimized, the resulting selected azimuthal index, or reference, corresponds to that azimuth of the formation about which the formation is most symmetric. In the case of a wellbore penetrating a sequentially layered formation, that azimuthal index represents the apparent azimuth of the sequential layers. The apparent azimuth is a measurement of interest to the wellbore operator. The apparent azimuth can be transmitted to the surface recording unit along with the image data.

The transformed Fourier transform coefficients are then quantized, meaning they are coarsened to a predefined scale. These quantized coefficients, now much reduced in bit size after quantization, are then coded with an efficient and error-correcting coding scheme into small "packets" (referred to herein as data points- "d-points") to be sent to the surface recording system using the pressure modulation telemetry. In the case that the azimuthal index was selected so as to minimize the energy of the anti-symmetric terms, then the quantization scheme can be prescribed so as to use fewer bits for these anti-symmetric terms as compared to the symmetric terms. The derivation of the parameter of interest, in this case azimuth, is thus an inherent feature of the compression scheme and is a unique property of this invention.

In the surface recording system, demodulated d-points are collected and error-corrected, if necessary. After the d-points are decoded into the transform coefficients, the coefficients are then inverse-transformed (reconstructed) to closely match the original parameter (data) values.

The reconstructed data are in the time domain, and are not correlated to a standard geographic reference. For the data to be useful in developing a proper image of the wellbore wall, they have to be displayed at the depth (axial position) in the wellbore at which they were recorded, and oriented properly with respect to a standard geographic reference. This required extra information that may not be contained in the image itself. Thus, in the surface recording system other information such as a time-depth record of the LWD instrument, and wellbore trajectory (directional survey) information are also required. In the case that the azimuthal index of the Fourier transform was selected so as to maximize the compressibility of the anti-symmetric component of the image, then that azimuthal index is also transmitted to the surface and combined with the decompressed image by the surface recording system to provide a properly oriented image.

This process can also be applied to a plurality of sensors located along the length of the drilling assembly. In such cases, the image from one sensor will be quite comparable to the image from another sensor, but there will be an inherent offset because the sensor data have been recorded (and possibly compressed) with respect to time. An optimal compression scheme for the plurality of sensors would be one which removed these time offsets from the different sets of image data. Indeed, for any pair of sensors, it is possible to compute, from the resulting images at each of the sensors, the value of time offset which maximizes the correlation between any two sensor images. This time offset is also a parameter which is of interest to the wellbore operator, because by dividing the sensor separation (distance between the two selected sensors) by the time offset, the result represents an estimate of the instantaneous velocity of the drilling tool assembly. The value of instantaneous velocity is of interest because typical inferences of velocity assume that this value is the same as the velocity of the pipe being lowered into the formation as measured at the earth's surface. This assumption does not take into account phenomena such as stretching or compressing the pipe. Instead, the method of this invention supposes that the estimate of the drill-bit velocity can be derived as part of the data compression process, transmitted to the surface recording unit and then subsequently used by the surface system to more accurately display the image data with respect to depth.

This method of compressing the data between a plurality of sensors provides a further benefit, namely that a processors within the downhole drilling assembly will have available an accurate estimate of the velocity and can use this estimate to convert images from the time-domain to the depth-domain. Depth domain converted images can be used in one embodiment to calculate an estimate of formation dip directly, which can be transmitted to the surface recording system in the LWD telemetry. This estimate of dip can then further be used to effectively rotate the wellbore image three-dimensionally to one which is oriented with respect to the direction of the original depositional environment. After such image rotation, images which appear as sinusoids around the wellbore will become planar and so offer the opportunity for even further image data compression.

Having explained the general environment in which data are acquired, compressed according to the method of the invention, transmitted and ultimately reconstructed, a more detailed description of the compression technique of the invention follows.

Figure 3:
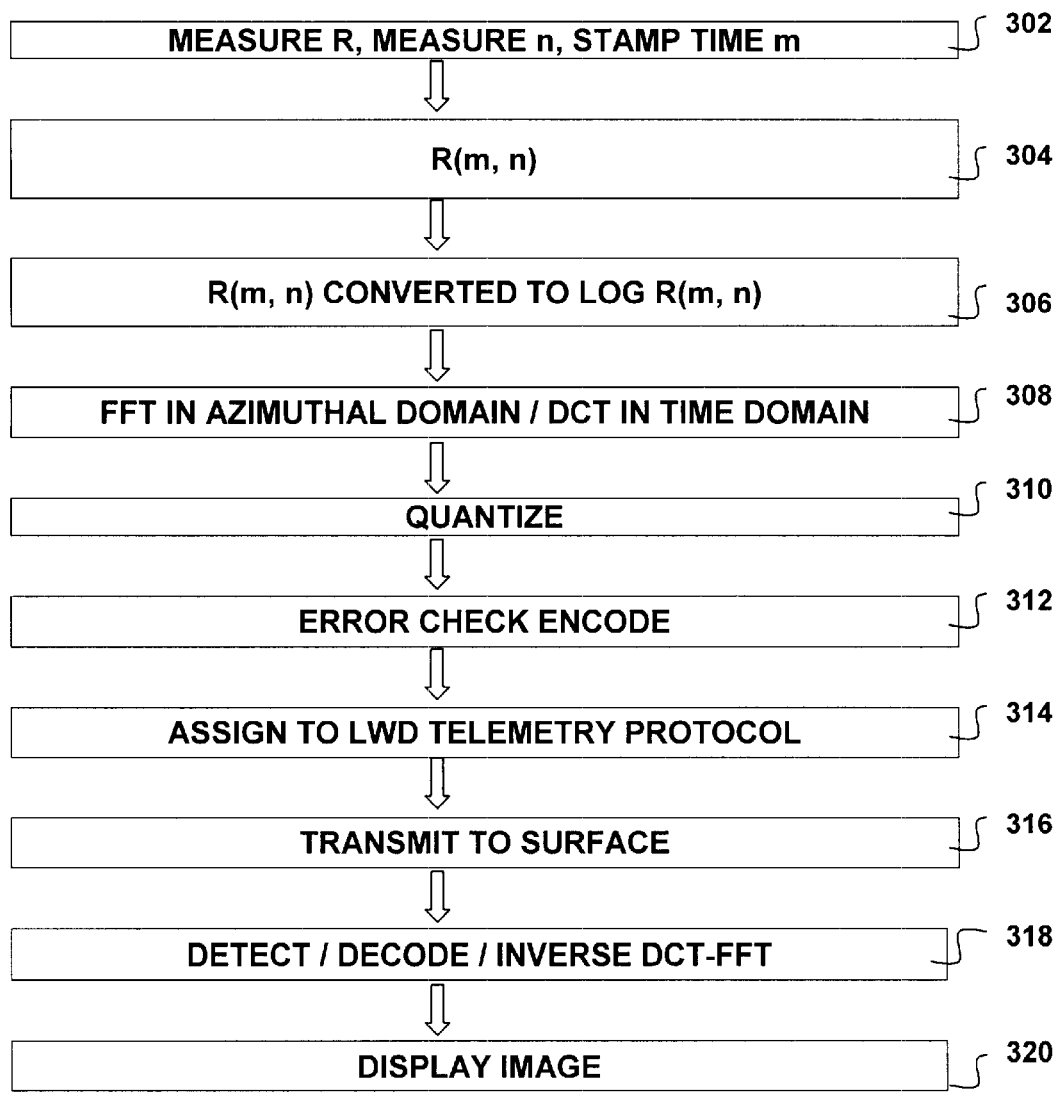
FIG. 3 is a flow chart of one example of a process according to the invention.

Data Acquisition: The LWD instrument, in this embodiment of the invention, acquires data while it is rotating, to provide measurements of resistivity which represent substantially all of the circumference of the wellbore. Data are azimuthally segregated or "binned", in this example, into 56 sectors. Each sector corresponds to the azimuthal orientation of the LWD instrument determined at the time of acquisition. As previously explained, the azimuthal orientation in this example is determined by magnetometers in the LWD instrument that are interrogated at substantially the same time as the resistivity sensors (electrodes). The measurements from each of the sensors optionally may be converted into resistivity and direction (orientation) values by a downhole processor in the LWD instrument, or may remain as voltages, frequencies, etc. The acquisition of data from the magnetometers and the resistivity electrodes is typically performed at a fixed rate set by a controller in the LWD instrument. Therefore the number of measurements made during each full rotation of the LWD instrument will depend on the speed of the rotation. Data acquired during a typical 10 second scan time period (actual measurements are made only during 4 seconds of this period in the instrument of this embodiment) are stored as one scan. Typical rates of penetration are such that the change in axial position during the acquisition of a scan is small in comparison with the sensor axial resolution. A counter in the instrument processor indicates how many scans are stored in a frame buffer. In this embodiment, a data "frame" consists of 16 time-contiguous scans. Each frame in this example contains about 3 minutes (16×10=160 seconds) of the most recently acquired data. Referring now to FIG. 3, acquisition is shown at box 302. The data are binned, as previously explained, according to the azimuthal position of each measurement at the time of measurement (shown as "MEASURE n" in FIG. 3 at 302) and are "stamped" with the acquisition time, also shown at 302 in FIG. 3.

Although this embodiment of the invention includes sensors disposed on the LWD instrument at a single azimuthal position, and the data are acquired during rotation of the instrument, it should be clearly understood that a similar result will be obtained by recording measurements using sensors disposed at azimuthally distributed positions about the instrument, where the measurements may be made either while rotating the instrument, or while the instrument is substantially rotationally fixed. An example of an instrument which includes azimuthally spaced apart resistivity sensors is described in U.S. Pat. No. 5,426,368 issued to Benimeli et al and assigned to the assignee of this invention. For the method of this invention, it is only necessary to include azimuthally distributed measurements of the formation property being evaluated.

Synchronization: In this embodiment of the invention, a telemetry controller in the LWD instrument controls the generation of compressed data for transmission to the surface recording unit. A new frame starts when a first d-point is requested by the LWD telemetry controller. Compressed data from the previous frame that are not applied to the LWD telemetry are abandoned. The telemetry controller is typically programmed to request the first d-point only when all the d-points of the previous frame have been transmitted in the pressure modulation telemetry, or when the telemetry is initiated (typically when drilling fluid ["mud"] pumps are turned on). It should be clearly understood that the manner of synchronizing acquisition and/or compression of data according to this embodiment are a matter of choice for the system designer and are not intended to limit the invention.

Transformation: Immediately after receiving the data request from the controller, a processor in the LWD instrument (which is typically a different processor but may be the same as the telemetry processor in some implementations) initiates the compression routine for the latest 16 scans (frame) in the buffer. First, a scale or range compression is performed on the values of the parameter in the frame. In this embodiment, the logarithm of each parameter value in the buffer is calculated, as shown at 306 in FIG. 3. Calculating the logarithm of the parameter values is well suited to range compression of resistivity data, however is should be understood that other types of range compression can be used with the method of the invention. Other types of range compression include, for example, calculating a fractional exponential of the parameter value (raising the value to a positive number exponent less than one). The range compression actually used should be suited to the data range and data type.

Then a fast Fourier transform of the logarithm of the value in the azimuthal domain is performed, and then a discrete cosine transform of the transformed data in the time domain is performed. The data transformation is shown at 308 in FIG. 3. The order in which the transforms are performed does not affect the operation of the compression technique. Mathematically the transforms are expressed as $$F(0,k)=\Sigma m \Sigma n\ e^{2i\pi(km/M)} \mathrm{Log}_{10}[R(m, n)][2/MN]^{1/2} F(j, k)=\Sigma m \Sigma n$$
$$\cos[(2j-1)n\pi/(2N)]e^{2i\pi(km/M)}\ \mathrm{Log}_{10}[R(m, n)][2/(MN)]^{1/2}$$

where $\Sigma m$ represents summation from m=1 to m=M=56 (for 56 scans per time period), and $\Sigma_n$ from n=1 to n=N=16. (16 scans per frame) j=1,2, . . . N and k=0,1,2, . . . M−1. R(m,n) is the resistivity values at azimuthal index m and time index n. log(R) is used instead of R for transformation because resistivity values encountered in subsurface earth formations typically span a large numerical range. The use of log(R), as previously explained, substantially reduces the range of values which must be encoded and transmitted. A particular benefit of calculating the logarithm of the parameter (resistivity) value is that visual (image) presentations made from such data usually adopt a logarithmic color scale. Compression on log(R) enables a much larger compression ratio for the same quality of image as compression of the actual resistivity value.

The azimuthal indexing can be with respect to a non-geological axis such as the direction of the gravity vector or of the direction of the earth's magnetic field. Alternatively, it can be with respect to a value which is itself derived from the image data. The preferred value for compression is that value which minimizes the imaginary component of $e^{2i\pi(km/M)}$. Choosing this azimuthal index corresponds to minimizing the contribution of that part of the image which is anti-symmetric about the azimuthal index. In the case that the wellbore penetrates a series of "dipping beds" (formations having layer boundaries inclined at an angle oblique to the wellbore axis), this index is equal to the apparent azimuth of those beds. The apparent azimuth is a parameter of interest to the wellbore operator. It can be transmitted to the surface along with the compressed image data.

Quantization: The values of the transform coefficients are divided by a predefined quantizer, $Q(j, k)$, and then converted to an integer, $q(j, k)=F(j, k)/Q(j, k)$, to reduce the information content. The quantizer Q in this embodiment takes the form $$\begin{aligned} Q(j,k) &= (0.04[1+4(1+j+k)]) && \text{for } j+k < 25 \\ &= 4 && \text{for } j = k = 0 \\ &= 40 && \text{for } j+k > 25 \text{ and } k <= 15 \\ &= \infty && \text{, for all other values of } j, k \end{aligned}$$

where constants 0.04, 4, 25, 40 are chosen, for particular implementations, to achieve a selected compression ratio. The larger the value of the quantizer, the larger the compression ratio. In this example, it is desirable that all the information in the 16 scan data frame be coded into 256 bits, including error-correction bits and other bits, such as a preamble to be compatible with the particular pressure modulation telemetry system used in this embodiment. Quantization is shown at 310 in FIG. 3.

Encoding The encoding of integer $q(j, k)$ is performed with an efficient entropy encoding mechanism, similar to the well known Huffinan encoding. First $q(j, k)$ is arranged into a one-dimensional array $q(m)$ in a predefined zigzag order starting from $q(0,1)$. Then each value $q(m)$ is identified with two numbers, starting from m=1. The number of bits (up to 10) required to encode each value q is n=floor[log2(|q|)]+1. n is encoded for n={1,2, . . . 10} as {010, 011, 1000, 1001, 1010, 1011, 1100, 1101, 1110, 1111}, respectively. These bits are follows by the encoded value of q, in n bits. The encoded value of q is I=q if q>0 and I=q+$2^n$-1 if q<0, expressed as an n bit binary number. For example, if q=-15, then n =4 and I=0. Thus q=-15 is coded as (1001)0000. An exception to these rules is for q=0, which is encoded as 00 followed by the encoded four bit binary number of zeros after it. For example, (00)0101 implies a 6 consecutive zeros including the current one.

Preferably, a preamble is included at the beginning of the data bits representing each frame. In one example, the preamble is a 16 digit stream: 0111111111111110. The padded 0 at the beginning and at the end of the preamble makes the d-point different from the full range value d-point. This preamble pattern will not occur in the encoded transformed coefficients, unless there are transmission errors. The encoding of image data only provides for maximum of 10 consecutive 1's in the bit stream.

In this particular embodiment, the averaged value of $<\mathrm{Log}_{10}(R)>$ is specially coded in each frame using 8 bits, according to the scheme I=255* [$\mathrm{Log}_{10}(R)$+1]/6 in the range of 0.1 to 100,000. The discretization introduces a maximum error of only about 5% in the value of resistivity decoded at the surface.

Error Correction Encoding. Error correction encoding should be used in a process according to the invention, because without error correction encoding, the probability of having one or more bit errors in a frame even under optimal pressure modulation telemetry transmission conditions can be as high as 60–70%. Because the transmitted bits represent the transformed coefficients, any error in transmitted bits within any particular image frame may render the whole image frame unusable.

There are many different error detection and correction algorithms available for use to achieve reliable data transmission. The error correction encoding technique ultimately used in any embodiment of the invention should take into account the probability of errors, the error patterns, the error tolerance and the overhead affordable in the particular telemetry system being used. Ease of encoding and decoding the data may also be important in cases where computational power of the encoding processor or the decoding processor is of concern. A common error in LWD pressure modulation telemetry is a called "burst-error", which occurs over 4–6 consecutive bits. Under normal LWD telemetry transmission conditions, the interval between two burst error occurrences is about 4–10 minutes.

A very effective method to deal with burst error is to use interleaving encoding techniques. First, the bit stream, defined as having length L, is separated into m data points (d-points, the same d-points used by the LWD telemetry system), for example, $d_1$–$d_m$, each of the m d-points has l bits(L=ml ). The first bit from each of the words $d_i$ is then used form a new word $W_1$, which has length m bits. This is also performed for the second bit in each d-point to form $W_2$, and so on. At the end of this process, there will be l such words. Thus, the stream of binary bits of length L is encoded into l words of length m, $W_1$ to $W_l$. Each of these words is subsequently encoded using the selected error correction encoding technique. Ideally, if a burst error occurs during the time span of the original bit stream, error bits will be distributed among different words so that each one of these words ideally will have less than 1 error. In another word, if the coding for single word $W_i$ is able to correct one bit of random error, the overall effect of interleaving is such that the code can correct up to l bits of errors, including a l-bit burst error, for the whole L-bit frame, provided that no two errors occur within the same word.

The particular error encoding algorithm used in this example for error correction is extended Hamming code of length m=32. Hamming codes are well suited for single error corrections because they correct single errors with the least redundancy. Every binary word $W_i$ is either a code word or it has a Hamming distance 1 from only one of the code words. The first 26 bits are information bits containing the encoded data. The rest of the bits are error-correction bits, including the last bit, which in this example is a parity bit.

For data compression in this embodiment, m=32 and l=8 are used to encode one frame of data (the previously referred to 16 scans). Because the same error-correction-encoding scheme applies on all words $W_1$ to $W_8$, the encoding algorithm can be applied to d-point $d_j$ instead of to individual bit locations repeatedly. The first 26 bits of word $W_i$, form the first 26 d-points $d_1$–$d_{26}$. The rest of the error-correction encoding words $d_{27}$–$d_{31}$ from $d_1$–$d_{26}$. are obtained by taking the binary OR of some d-points selected from $d_1$–$d_{26}$, i.e., $d_i = \Sigma\ e_{i,j}\ d_j$, where the summation should be understood as a binary OR operation, and the indices j runs over from 1 to 26 and i from 27 to 32. $e_{i,j}=0$ or 1 is a predefined matrix by the Hamming encoding algorithm. The last d-point $d_{32}$ is a parity d-point for all the other d-points from 1 to 31. The parity d-point is used to indicate more than one bit error in each bit position. The overhead in this embodiment is about 16%. For each word $W_i$, the error-correction scheme can detect two random errors and correct one of these. For each frame of 256 bits, the encoding scheme just described can correct up to 8 bits of burst error, and can also detect additional burst or random errors. Under normal LWD pressure modulation telemetry conditions, the probability of having two burst errors within the same frame (within 160 seconds of each other) is typically quite low, because, as previously explained, burst errors normally occur between 4–10 minutes apart. It is desirable, however, to be able to detect uncorrectable errors when they do occur.

The addition of 6 error-correction and parity-checking d-points $d_{27}$ to $d_{32}$ does create 30 the possibility of accidentally creating a preamble pattern, because unlike the encoded coefficients, the parity d-points are calculated from the previous twenty-six d-points. However, the probability of such an occurrence is relatively low, estimated to be less than 1 out of 13,000 image-blocks.

Thus each frame (16 scans) is encoded into 32 d-points each of which is 1 byte (8 bits) long. The first two d-points are the preamble, and the last six d-points are error-correction d-points. Encoding and error-check encoding are shown at 312 in FIG. 3.

At 314 in FIG. 3, the encoded data are assigned to a suitable location in the pressure modulation (LWD) telemetry protocol. The location is a matter of convenience for the system designer and is not intended to limit the invention. At 316 the data are transmitted to the surface using the pressure modulation telemetry.

Although this embodiment is directed to using pressure modulation telemetry, it is clearly within the contemplation of this invention that other forms of LWD telemetry, such as electromagnetic telemetry, can be used with this invention.

Accordingly, the terms "measurement-while-drilling telemetry" and "LWD telemetry" are intended to include all forms of telemetry known in the art for communicating data to and/or from the earth's surface by a sensor disposed in a wellbore during the drilling of the wellbore, and with no hard electrical connection between the sensor and a recording system disposed at the earth's surface.

Image Decoding and Decompression. Image decoding includes reconstructing the values of the transformed coefficients from the d-points in each frame. The first step in the decoding process is to identify the beginning of the frame out of all the d-points received, i.e., to find the preamble. This is done by simply looking for the correct preamble d-points (127, 254) within a range of 32 d-points, $d_i$–$d_{32}$. A successful decoding as described below, is also an indication that the d-points are grouped correctly. This is a very useful strategy when a ID is corrupted. The decoding takes little time and thus can be attempted many times to locate the correct group of d-points in case the correct preamble is not found.

After the preamble is identified, the parity bits are checked and error corrections are made when necessary. Error correction is straightforward for Hamming code. d-points $d'_{27}$ to $d'_{31}$ from $d_1$ to $d_{26}$, are reconstructed the same way as constructed in the encoding process. Then a syndrome $S(1:5)=(d'_{27}{}^\wedge d_{27},\ d'_{28}{}^\wedge d_{28},\ d'_{29}{}^\wedge d_{29},\ d'_{30}{}^\wedge d_{30},\ d'_{31}{}^\wedge d_{31})$ is calculated. The binary number formed by taking the one bit from each of syndrome $S_1, S_2, S_3, S_4, S_5$ at the same location, if non zero, indicates the d-point number for which the corresponding bit can be in error. Whether this is correctable depends on the value of $S_6 = d_{32}'{}^\wedge d_{32}$. For example, if the $4^{th}$ bit of $S_1$ to $S_5$ forms a number 01011 (number 11), then this means the $4^{th}$ bit of $W_{11}$ could be wrong. If the $4^{th}$ bit of $S_6$ is 1, then the $4^{th}$ bit of $d_{11}$ must be corrected. However, if the $4^{th}$ bit of $S_6$ is 0, that means more than one bit error have occurred and one has to depend on other means to do the correction. The same logic applies to other bits.

Once the frame is error-corrected, decoding becomes simply a task of looking up correctly the code words in a code "dictionary", as described in the encoding paragraph in the downhole process section. More specifically, starting from the fourth d-point, the following trees are used to decode the number of bits n:

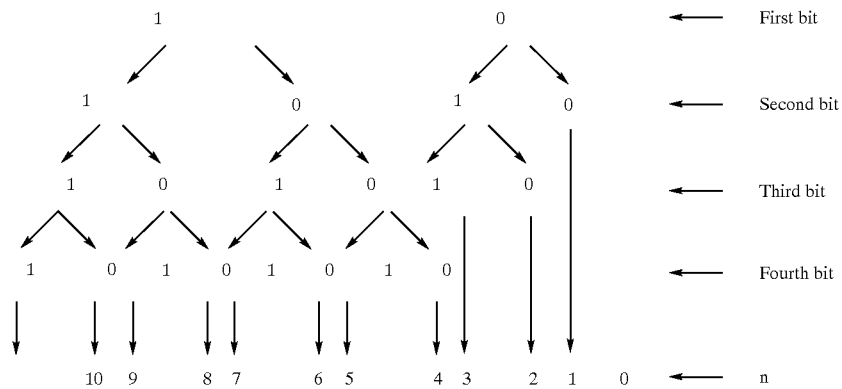

The number n of bits followed is the encoded binary value I. The coefficient q(m) is simply:

$$q(m) = I \quad \text{if } I >= 2^{n-1}$$
$$= I - (2^n - 1) \quad \text{otherwise}$$

An exception is when n=0, then the q(m)=0 and the next four bits are the number of extra zeros following this one. Notice also <$Log_{10}(R)$> is encoded in the third d-point and can be easily obtained. The coefficient F(j,k) can then be reconstructed from the predefined quantizer Q(j,k) and the q(m) values according to the predefined zigzag sequence, F(j,k)=q(m)*Q(j,k).

Once decoding is done for the image frame, each coefficient F(j, k) is established. Then an inverse transform is performed to reconstruct the data values. This involves first an inverse discrete cosine transform and an inverse Fourier transform as follows:

$$Log_{10}(R(m, n)) = \Sigma j \Sigma k \cos[(2j+1)n\pi/(2N)]e^{2i\pi(km/M)}F(j, k)][2/(MN)]^{1/2} + \Sigma k \, e^{2i\pi(km/M)}F(0,k)][2/MN]^{1/2} + <Log_{10}(R)>$$

where the sum does not include the term k=0 and j=0. The end result is 16-scans (56 bin in each scan) of data that approximate the original data acquired by the LWD instrument. All of the foregoing detection, decoding and inverse Fourier, inverse discrete cosine transform process elements are shown at 318 in FIG. 3.

To display the data as an image, three major tasks are involved: time-depth merge, image azimuth alignment, and graphical display.

Time-depth merge: Each scan of the image acquired by the LWD instrument represents measurements during a selected acquisition interval (for the LWD instrument shown in Clark '036 this is typically on the order of 10 seconds). The data are thus time based. However, the image needs to be displayed with respect to depth. The corresponding depth for each scan of the image must be determined. For better quality image display, an improved time-depth merge is preferred due to the fine resolution of the buttons (⅓") on the instrument described in Clark '036. A technique for interpolating the data in the time domain and then performing a time-depth merge to form data properly correlated to depth bases has been shown to significantly improve the quality of the wellbore image. A further improvement in the image quality can be made if an estimate of drilling tool velocity is transmitted to the surface. Such an estimate can be derived from image data as part of the downhole compression process.

Image orientation: The original 56 bins of data are azimuthally referenced by the location of buttons with respect to the projection of the earth's magnetic field onto the plane perpendicular to the axis of the LWD instrument. However, to facilitate interpretation, images made from the data are typically displayed with respect to a fixed reference, such as top of the wellbore with respect to gravity or geographic north. An alternative procedure has also been described whereby the azimuthal bin location (reference index) is chosen so as to minimize the contribution of the sine terms in the Fourier transform. In this case, that azimuthal bin location should be transmitted to the surface along with the compressed data. If the azimuthal bin location downhole is derived from the earth's magnetic field then the bin location corresponding to the top of the wellbore or to geographic north can be calculated from measurements of the wellbore trajectory and earth magnetic field declination information in the geographic location of the wellbore. The wellbore trajectory information is typically obtained from directional surveys performed during the drilling of the well. In one embodiment, the directional survey data are acquired by sensors in the LWD instrument, and are transmitted to the surface recording system by pressure modulation telemetry. Once the reference bin location is determined, the image can be oriented with respect to the selected reference simply by shifting the image in the azimuthal direction to cause the measured orientations to correspond to the referenced orientations.

Graphic display: A graphic device is required to display the reconstructed image in real-time. The graphic device should also be able to update the display of the image automatically as new data are decoded and reconstructed. Graphic devices which are capable of displaying the image are well known in the art. See for example, U.S. Pat. No. 4,607,352 issued to Seeman et al and assigned to the assignee of this invention. Displaying the image is shown at 320 in FIG. 3.

Determining Amount of Instrument Movement Along the Wellbore and Earth Formation Bedding Attitude (Dip) While Drilling: The data compression technique described in this invention makes possible a technique for taking data from an LWD instrument such as described in Clark '036 and determining the amount of movement of the instrument with respect to time, or alternatively, to determine a rate at which the instrument is moving through the wellbore during drilling. The data compression technique and the measurements made by the instrument in Clark '036 also make possible a calculation of formation bedding attitude (known in the art as "dip") within the instrument processor downhole if desired. Such calculations may be included in the LWD telemetry for communication to the surface recording system, or may be stored in the instrument memory or buffer until the instrument is removed from the wellbore to the earth's surface. One aspect of the instrument in Clark '036 which makes this process work well is that the instrument has a plurality of axially spaced apart sensors disposed at the same azimuthal orientation on the instrument.

Figure 4:
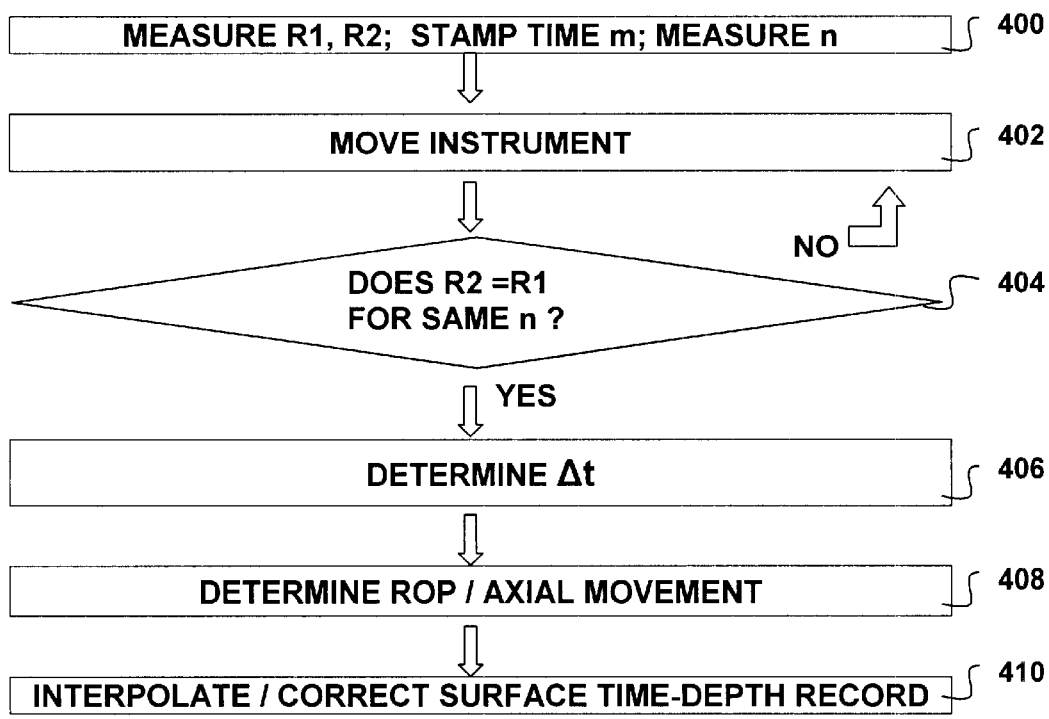
FIG. 4 is a flow chart of one example of a method for determining rate of penetration.

Downhole Calculation of Rate of Penetration: Calculating the optimum compression from image data from a plurality of axially spaced apart sensors requires first removing from such data that component which is substantially redundant from one set of sensor data to the data measured by another sensor. This redundancy can be found by correlating the data from one sensor with that measured by another sensor with respect to time difference between the respective sensor measurements. A time-offset can be determined which maximizes the correlation between the two sensor data sets, and thus minimizes the redundancy between the images. That value of time offset is also a useful measurement of interest, however, because it directly relates to the amount of movement, or rate of penetration, of the drilling tool assembly. Specifically, the rate of penetration is given by D/T where D is the known (fixed) distance between the sensors on the instrument and T is that value of time-offset which maximizes the correlation between the respective sets of sensor measurements. As previously explained the LWD instrument includes a local measuring device 200 which includes a plurality of electrodes, shown at first electrode 226, second electrode 227, an third electrode 228, from each of which is made a voltage measurement which corresponds to resistivity of the formation adjacent to the particular electrode. As the wellbore (11 in FIG. 1) is drilled, and the LWD instrument moves axially along the wellbore, the first electrode 226 will pass a particular formation feature. When the LWD instrument is rotating, the first electrode 226 will pass the particular formation feature at certain azimuthal orientation. As the measurement of the resistivity at the first electrode 226 is made of the particular formation feature, correspondingly, the time of the measurement and the rotary orientation will be recorded also (shown at 400 in FIG. 4). The orientation is measured, in this embodiment, using magnetometers as previously described herein. As the instrument 200 continues to move along the wellbore during drilling (shown at 402 in FIG. 4) eventually the second 227 electrode will pass the same particular formation feature. The point in time at which the second electrode 227 has reached the same particular earth formation feature can be determined by correlating orientation-correspondent resistivity measurements from the first electrode 226 to resistivity measurements from the second electrode 227 (shown at 404 in FIG. 4) If the instrument has not yet moved enough so that the second electrode 227 has measured the same formation, the instrument is moved further (404 in FIG. 4). Correlation is performed using any one of a number of correlation techniques well known in the art. Because the time at which each resistivity measurement was acquired is recorded, an amount of elapsed time can be determined between the correlated measurements from the first electrode 226 and from the second electrode 227 which correspond to the same particular formation (406 in FIG. 4). When it is determined by correlation that the second electrode 227 is at the particular formation feature, the time of recording for the first electrode 226 measurement is simply subtracted from the time of recording for the formation-corresponding second electrode 227 measurement. The distance between the first 226 and second 227 electrodes is known and fixed by the instrument design. Therefore, the LWD instrument will have moved a known distance in a determined amount of time. The rate of motion of the instrument 200 along the wellbore (rate of penetration—"ROP") can be directly calculated from these time and distance values (408 in FIG. 4). These calculations can also, or alternatively, be performed using measurements from the third electrode 228 in combination with measurements from either or both the first 226 and second 227 electrodes.

Alternatively (and more practically), azimuthally corresponding measurements made at a plurality of, or at all of the azimuthal orientations of the LWD instrument during acquisition, at each of the first 226, and second 227 electrodes can be correlated. More specifically, because the azimuthal orientation of each measurement can be "tagged" to the measurement along with the time of measurement, azimuthally corresponding ones of the measurements made at each of the first and second electrodes can be correlated for any or all of the azimuthal positions at which the measurements are made. By combining correlations over a plurality of azimuthal orientations, the quality of the correlation, and resulting rate of penetration determination, can be improved.

A frame of data is acquired from each sensor. Here, the frame is comprised of several scans. Each scan is a time acquisition of the formation parameter at a plurality of azimuths around the entire wellbore. Each frame is thus a 2-dimensioned array, time and azimuth, of the formation parameter as measured by each sensor. The two sensors share the same azimuth reference. The best time correlation between the two frames gives the difference in time between the two sensors. Choices to make are the number of scans in the frame, and the number of scans to include in the correlation.)

A unique property of the data compression technique described herein allows the time-offset between the sensor data to be determined from the transformed data as part of the compression process because the correlation of data in the time-domain precisely corresponds to the convolution of data in the wavenumber domain of the discrete cosine transform.

Correction of Surface Depth Measurement for Drill Pipe Compression: The determination that the LWD instrument has moved a known distance, performed as described above, can be used to calibrate or check a depth measurement system used at the earth's surface to generate a time-depth record of movement of the LWD instrument along the wellbore. As is well known in the art, LWD instruments record measurements of properties of earth formations with respect to time of recording. A depth measuring device, disposed at the earth's surface, is used in conjunction with the surface recording system to generate a record of the depth of the LWD instrument in the wellbore, and the corresponding time of each recorded instrument depth. To generate a conventional "well log", which displays formation property measurements with respect to depth in the wellbore, the time "stamped" measurements, which are stored in the LWD instrument, are subsequently correlated to the time-depth record made at the earth's surface by the surface recording system.

It is well known in the art that during drilling of a wellbore, changes in axial loading ("weight on bit") on the drilling tool assembly may cause some degree of difference between the actual depth of the LWD instrument in the wellbore, and the depth recorded by the surface-located depth measuring device. In this aspect of the invention, time-corresponding calculations of the motion of the instrument made as previously explained, can be correlated to the time-depth record made at the earth's surface. The correlation can be used to adjust the time-depth record made at the surface to compensate for depth record inaccuracies resulting from drilling string axial compression and/or axial elongation resulting from changes in weight on bit during drilling (410 in FIG. 4).

Downhole Dip Calculation: Another application for the data compression scheme of in this invention is to use multiple measurements of the formation property (resistivity in this embodiment) determined, as explained above, which are made from the same earth formation by sensors spaced apart by a known distance in order to determine the formation dip by calculation downhole in the LWD instrument itself. Such calculated dip values can be transmitted to the earth's surface by the LWD telemetry, and/or may be stored in the memory or buffer in the LWD instrument for later retrieval and processing/display. The calculation of the dip value is closely connected with the data compression scheme described herein, and the data compression and dip determination operations can be done simultaneously, as will be further explained.

One method of calculating formation dip with respect to the wellbore, as is well known in the art, includes making measurements of a formation property at a plurality of depths along a wellbore, and at a plurality of azimuthal orientations about the wellbore. Boundaries ("bedding planes" or "bed boundaries") are typically inferred at places where the value of the formation property (resistivity in this embodiment) changes a substantial amount. Formation "dip" is determined by calculating an angle of intersection of bedding planes with respect to the wellbore axis. The angle of intersection is typically determined by calculating an axial displacement of the bedding plane at various azimuthal orientations with respect to the wellbore. The angle of intersection is then combined with measurements of the wellbore trajectory to calculate the attitude of the bedding planes with respect to fixed geographic references, usually gravity (vertical) and geographic north. The angle of intersection is also commonly referred to as the apparent dip. Methods for calculating angle of intersection from axial displacement and conversion of angle of intersection to geographically-referenced bedding attitude are well known in the art. See for example, U.S. Pat. Nos. 4,251,773; 4,305,975; 4,316,250; and 4,355,357 all of which are assigned to the assignee of this invention.

Figure 5:
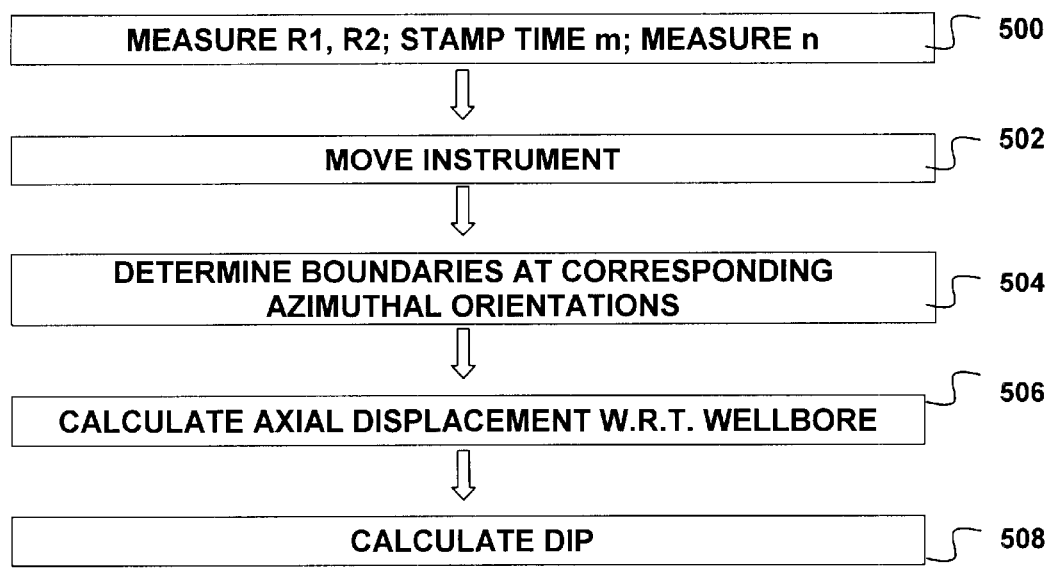
FIG. 5 is a flow chart of one example of a method for determining dip of earth formations.

The instrument in Clark '036 is well suited to make measurements useful in earth formation dip determination, because the electrodes make measurements at a plurality of azimuthal orientations about the wellbore when the LWD instrument is rotating (500 in FIG. 5) and moving along the wellbore (502 in FIG. 5). In an embodiment of this aspect of the invention, axial displacements of bedding planes with respect to the wellbore are determined by correlating the resistivity measurements made over a selected axial span at various selected corresponding azimuthal orientations (504 in FIG. 5) about the wellbore. Correlation in this embodiment is performed in the LWD instrument processor. When the measurements made at the selected rotary orientations about the wellbore correlate so as to indicate that the same earth formation has been traversed, a displacement with respect to azimuthal (or rotary) orientation can be calculated (506 in FIG. 5). As is known in the art, determining displacement by correlating measurements made at various azimuthal orientations about the wellbore requires a determination of the axial displacement of the instrument between these measurements. The previously described process for determining axial movement of the LWD instrument can be used in combination with the correlation technique just described.

The previously described method for determining axial movement (velocity) of the LWD instrument (and hence the drilling tool assembly) determines an amount of time taken by the instrument to move a known, fixed distance. It can be advantageous, in determining formation dip, to be able to determine the axial position of the instrument at times between successive measurements of the same earth formation by the various electrodes (226, 227, 228 in FIG. 3). One method for inferring the axial position of the instrument between successive measurements of the same earth formation by the various electrodes is to linearly interpolate the axial position between times at which the electrodes measure the same particular earth formation. Finally, the dip of the formation can be determined (508 in FIG. 5) using any well known method for determining dip from axial displacement thus determined, and trajectory of the wellbore. The trajectory of the wellbore can be determined, as is well known in the art, by sensors disposed in the LWD instrument such as magnetometers and accelerometers.

An embodiment of the data compression invention herein provides an estimate of formation azimuth by minimizing the energy of the sine terms of the Fourier components and provides an estimate of the drill-bit velocity by minimizing the redundancy of the transformed data from one sensors to another. As described above, this allows an estimate of the formation dip to be made using traditional techniques that are well known in the art. A further embodiment of the data compression technique, however, provides for the minimization of the sinusoidal terms of the Fourier transform by estimating the formation azimuth and the derivation of the formation dip directly from the cosine terms of the Fourier transform. The invention has been described herein with particularity as to certain embodiments. It will be apparent to those skilled in the art that other embodiments of the invention can be readily devised which do not depart from the scope of the invention as set forth by the attached claims.

What is claimed is:

1. A method for compressing a frame of data representing parameter values, a time at which each of the parameter values was recorded, and a corresponding azimuthal orientation of each of the parameter values at the time each was recorded, comprising:

range compressing the parameter values;

selecting an azimuthal reference so that the parameter values are substantially periodic with respect to the azimuthal reference;

performing a two-dimensional transform to the scale compressed parameter values, an output of the transform comprising a set of coefficients; and quantizing the coefficients.

2. The method as defined in claim 1 wherein the two-dimensional transform comprises a Fourier transform in the azimuthal domain and a discrete cosine transform in a domain corresponding to the time of recording.

3. The method as defined in claim 2 wherein the corresponding domain is the depth domain.

4. The method as defined in claim 2 wherein the corresponding domain is the time domain.

5. The method as defined in claim 1 further comprising encoding the quantized coefficients.

6. The method as defined in claim 5 wherein the encoding the quantized coefficients comprises efficient entropy encoding.

7. The method as defined in claim 6 further comprising error-correction encoding the encoded quantized coefficients.

8. The method as defined in claim 7 wherein the error-correction encoding comprises interleaved encoding, the interleaved encoding comprising:

separating bits in the frame of data into words each having equal length;

selecting correspondingly positioned bits in each of the words and grouping the selected bits to form new words; and Hamming encoding the new words.

9. The method as defined in claim 8 further comprising applying the Hamming encoded new words to a selected location in a telemetry sequence, and transmitting the Hamming encoded new words to a recording unit.

10. The method as defined in claim 9 wherein the telemetry sequence comprises measurement while drilling telemetry.

11. The method as defined in claim 1 wherein the parameter comprises electrical resistivity of earth formations penetrated by a wellbore.

12. The method as defined in claim 1 wherein the parameter comprises acoustic reflectance amplitude of earth formations penetrated by a wellbore.

13. The method as defined in claim 1 wherein the parameter comprises gamma—gamma density of earth formations penetrated by a wellbore.

14. The method as defined in claim 1 wherein the range compressing comprises calculating a logarithm of each of the parameter values.

15. The method as defined in claim 1 wherein the range compressing comprises calculating a fractional exponential of each of the parameter values.

16. The method as defined in claim 2 wherein the azimuthal reference is selected to minimize an energy in sine terms in the Fourier transform.

17. The method as defined in claim 16 wherein a dip azimuth of earth formations is estimated by determining a geographic orientation of the azimuthal references selected to minimize the energy of the sine terms.

18. A method for acquiring and communicating image-producing data to a surface recording unit, comprising:
measuring a value of a parameter of an earth formation penetrated by a wellbore at azimuthally spaced apart positions in the wellbore;
determining an azimuthal orientation at which each of the values of the parameter is measured;
determining a time at which each of the values of the parameter is measured;
compressing the parameter values;
encoding the compressed parameter values; and
applying the encoded, compressed parameter values to a selected position in a telemetry format for transmission to the surface recording unit.

19. The method as defined in claim 18 wherein the parameter comprises electrical resistivity.

20. The method as defined in claim 18 wherein the parameter comprises acoustic reflectance amplitude.

21. The method as defined in claim 18 wherein the parameter comprises gamma—gamma density.

22. The method as defined in claim 18 wherein the telemetry comprises measurement while drilling telemetry.

23. The method as defined in claim 18 further comprising:
detecting the encoded compressed, parameter values at the recording unit from the telemetry;
decoding and decompressing the encoded, compressed parameter values;
reconstructing the values of the parameter and the corresponding azimuthal orientations;
adjusting the corresponding azimuthal orientations with respect to a trajectory of the wellbore proximate to a position therein at which the parameter values were measured to provide an orientation of each of the parameter values with respect to a selected geographic reference; and
developing an image from the reconstructed values and corresponding geographic orientations.

24. The method as defined in claim 18 wherein the compressing comprises identifying an azimuthal reference, performing a Fourier transform to the parameter values in the azimuthal domain with respect to the azimuthal reference and performing a discrete cosine transform to the Fourier-transformed parameter values in a domain corresponding to the time of recording, the Fourier transform and the discrete cosine transform providing an output comprising coefficients.

25. The method as defined in claim 24 wherein the corresponding domain is the depth domain.

26. The method as defined in claim 24 wherein the corresponding domain is the time domain.

27. The method as defined in claim 24 further comprising quantizing the output coefficients.

28. The method as defined in claim 27 further comprising encoding the quantized coefficients.

29. The method as defined in claim 28 wherein the encoding comprises efficient entropy encoding.

30. The method as defined in claim 28 further comprising error-correction encoding the encoded quantized coefficients.

31. The method as defined in claim 30 wherein the error-correction encoding comprises interleaved encoding, the interleaved encoding comprising:
separating bits in a frame of data into words each having equal length;
selecting correspondingly positioned bits in each of the words and grouping the selected bits to form new words; and
Hamming encoding the new words.

32. The method as defined in claim 24 wherein the azimuthal reference is selected for the azimuthal orientation, so as to minimize an energy in sine terms in the Fourier transform.

33. The method as defined in claim 32 wherein a dip azimuth of earth formations is estimated by determining a geographic orientation of the azimuthal references selected to minimize the energy of the sine terms.

34. A method for determining rate of penetration of a drilling assembly in a wellbore, comprising:
measuring, near the drilling assembly, a property of earth formations penetrated by the drilling assembly, the measuring performed by sensors at axially spaced apart locations;
recording a time at which each of the measurements of the property are made;
recording an azimuthal orientation of the sensors at the time each of the measurements is made;
correlating azimuthally corresponding ones of the measurements made at a first one of the spaced apart locations to measurements made at a second one of the spaced apart locations;
determining from the correlating when the first and the second one of the spaced apart location have made measurements in substantially the same earth formation; and
calculating the rate of penetration from a difference in time between the measurements made in the substantially same earth formation at the first and second spaced apart locations and from a distance between the first and second spaced apart locations.

35. The method as defined in claim 34 wherein the measured property of the formation comprises electrical resistivity.

36. The method as defined in claim 34 wherein the measured property of the formation comprises acoustic reflectance amplitude.

37. The method as defined in claim 34 wherein the measured property comprises gamma—gamma density.

38. The method as defined in claim 34 further comprising:
correlating the rate of penetration determined from the measurements at the first and the second axially spaced apart locations, to time correspondent measurements of a depth of the drilling assembly made by a sensor at the earth's surface; and
adjusting the measurements of the depth of the drilling assembly made by the sensor at the earth's surface for compression and extension of a drill pipe connecting the drilling assembly to a drilling rig at the earth's surface.

39. The method as defined in claim 34 further comprising:
making the measurements of the property at azimuthally spaced apart positions;
calculating, in an instrument forming part of the drilling assembly an axial displacement of bed boundaries of the earth formations with respect to orientation about the circumference of the wellbore by correlating axially spaced apart, azimuthally correspondent ones of the measurements; and determining a dip of the bed boundaries from the axial displacement and from measurements of trajectory of the wellbore.

40. The method as defined in claim 39 wherein the axial displacement is transmitted to the earth's surface by measurement-while-drilling telemetry.

41. The method as defined in claim 39 wherein the dip is calculated in the instrument and is transmitted to the earth's surface by the measurement-while-drilling telemetry.

42. The method as defined in claim 39 wherein the axial displacement is calculated by correlating a first frame of measurements of the property to a second frame of measurements of the property, the first frame and second frame each comprising measurements made over a selected time interval, the instrument forming part of the drilling assembly moving along the wellbore during each of the selected time intervals.

43. A method for determining dip of earth formations penetrated by a wellbore, comprising:

moving an instrument forming part of a drilling assembly along the wellbore;

measuring a property of the earth formations at azimuthally spaced apart positions using at least one sensor disposed at a selected axial position along the instrument, the measurements each including a record of an azimuthal orientation and a time at which the measurements are made;

determining an axial position of the instrument along the wellbore with respect to the time records, so as to determine an axial position of each of the measurements of the formation property;

determining an axial displacement of at least one layer boundary in the earth formations by correlating measurements made at selected, corresponding azimuthal orientations and at a plurality of the determined axial positions; and calculating the dip by combining the axial displacement with a measurement of the trajectory of the wellbore proximate the measurements of the formation property.

44. The method as defined in claim 43 wherein the azimuthally spaced apart positions are generated by rotating the instrument within the wellbore.

45. The method as defined in claim 43 wherein the azimuthally spaced apart positions are generated by providing a plurality of sensors on the instrument at azimuthally spaced apart positions.

46. The method as defined in claim 43 wherein the property of the formations comprises electrical resistivity.

47. The method as defined in claim 43 wherein the property of the formations comprises acoustic reflectance amplitude.

48. The method as defined in claim 43 wherein the property of the formations comprises gamma-gamma density.

49. The method as defined in claim 43 wherein the dip is calculated in the instrument in the wellbore and is transmitted to the earth's surface by measurement-while-drilling telemetry.

50. A method for determining dip of earth formations penetrated by a wellbore, comprising:

moving an instrument along the wellbore;

measuring a property of the earth formations at azimuthally spaced apart positions around the wellbore using at least one sensor disposed at a selected axial position along the instrument, the measurements each including a record of an azimuthal orientation and a time at which the measurements are made;

correlating the measurements made by the at least one sensor to identify boundaries of layers in the formation measured by the at least one sensor, and determining a time difference between which the at least one sensor having measured corresponding ones of the layer boundaries;

computing from this the difference an estimate of formation dip that would correspond to a fixed rate of movement of the instrument along the wellbore;

transmitting to the earth's surface the estimate of formation dip;

making a measurement at the earth's surface of the rate of movement of the instrument along the wellbore;

using the measurement of movement made at the surface to convert the transmitted dip estimate into an estimate of the apparent dip of the corresponding layer boundaries;

combining the estimate of apparent dip with a measurement of the trajectory of the wellbore proximate the measurements made of the formation property to provide an estimate of the dip of the formation layer boundaries.

51. The method as defined in claim 50 wherein the azimuthally spaced apart positions are generated by rotating the instrument within the wellbore.

52. The method as defined in claim 50 wherein the azimuthally spaced apart positions are generated by providing a plurality of sensors on the instrument at azimuthally spaced apart positions.

53. The method as defined in claim 50 wherein the property of the formations comprises electrical resistivity.

54. The method as defined in claim 50 wherein the property of the formations comprises acoustic reflectance amplitude.

55. The method as defined in claim 50 wherein the property of the formations comprises gamma-gamma density.

56. A method for determining dip of earth formations penetrated by a wellbore, comprising:

moving an instrument along the wellbore;

measuring a property of the earth formations at azimuthally spaced apart positions using at least one sensor disposed at a selected axial position along the instrument, the measurements each including a record of an azimuthal orientation and a time at which the measurements are made;

selecting an azimuthal reference which minimizes a sinusoidal component of an azimuthal Fourier transform of the data with respect to that reference;

generating a discrete cosine transform of the Fourier-transformed data;

identifying from the resulting 2D transformed data a corresponding apparent dip of the formation with respect to the wellbore;

combining the corresponding apparent dip with a measurement of the trajectory of the wellbore proximate the measurements of the formation property to provide an estimate of the dip of the earth formation.

57. The method as defined in claim 56 wherein the azimuthally spaced apart positions are generated by rotating the instrument within the wellbore.

58. The method as defined in claim 56 wherein the azimuthally spaced apart positions are generated by providing a plurality of sensors on the instrument at azimuthally spaced apart positions.

59. The method as defined in claim 56 wherein the apparent dip of the formation with respect to the wellbore is computed from a non-sinusoidal component of the Fourier transformed data.

60. The method defined in claim 56 wherein the effect of the apparent dip of the formation with respect to the wellbore is removed from the 2D transformed data and the resulting data is then compressed for transmission to the surface.

61. The method as defined in claim 56 wherein the property of the formations comprises electrical resistivity.

62. The method as defined in claim 56 wherein the property of the formations comprises acoustic reflectance amplitude.

63. The method as defined in claim 56 wherein the property of the formations comprises gamma—gamma density.

64. The method as defined in claim 1 wherein the parameter comprises one of photoelectric factor or porosity of an earth formation penetrated by a wellbore.

65. The method as defined in claim 1 wherein the parameter comprises instrument standoff in a wellbore.

66. The method as defined in claim 1 wherein the parameter comprises a wellbore caliper.

67. The method as defined in claim 1 wherein the parameter comprises an acoustic signal.

68. The method as defined in claim 1 wherein the parameter comprises a nuclear magnetic resonance property of an earth formation penetrated by a wellbore.

69. The method as defined in claim 18 wherein the parameter comprises one of photoelectric factor or porosity.

70. The method as defined in claim 18 wherein the parameter comprises a wellbore caliper.

71. The method as defined in claim 18 wherein the parameter comprises an acoustic signal.

72. The method as defined in claim 18 wherein the parameter comprises a nuclear magnetic resonance property of the earth formation.

* * * * *